United States Patent [19]

Jiang et al.

[11] Patent Number: 4,894,791

[45] Date of Patent: Jan. 16, 1990

[54] DELAY CIRCUIT FOR A MONOLITHIC INTEGRATED CIRCUIT AND METHOD FOR ADJUSTING DELAY OF SAME

[75] Inventors: Ching-Lin Jiang, Dallas; William J. Podkowa, Plano, both of Tex.

[73] Assignee: Dallas Semiconductor Corporation, Dallas, Tex.

[21] Appl. No.: 828,230

[22] Filed: Feb. 10, 1986

[51] Int. Cl.$^4$ ............................................. H03K 5/13
[52] U.S. Cl. .................... 364/570; 307/597; 307/603; 328/55; 328/78
[58] Field of Search ................. 307/597, 603; 328/55, 328/78; 364/570

[56] References Cited

U.S. PATENT DOCUMENTS

| | | | |
|---|---|---|---|
| 3,032,714 | 5/1962 | Cohen | 307/597 |
| 3,047,807 | 7/1962 | Langan | 328/78 |
| 3,073,971 | 1/1963 | Daigle, Jr. | 307/88.5 |
| 3,073,972 | 1/1963 | Jenkins | 307/88.5 |
| 3,115,586 | 12/1963 | Lucchi | 307/597 |
| 3,502,994 | 3/1970 | Ott et al. | 328/55 |
| 3,660,666 | 5/1972 | Hendrickson | 307/597 |
| 3,714,623 | 1/1973 | Mickler | 328/55 |
| 4,101,821 | 7/1978 | Kirby | 328/55 |
| 4,110,640 | 8/1978 | Ito | 307/303 |
| 4,330,750 | 5/1982 | Mayor | 307/597 |
| 4,361,771 | 11/1982 | Reinke | 307/497 |
| 4,521,694 | 6/1985 | Ryczek et al. | 307/266 |
| 4,591,745 | 5/1986 | Shen | 307/597 |
| 4,637,018 | 1/1987 | Flora et al. | 328/55 |
| 4,644,184 | 2/1987 | Miyawaki et al. | 307/603 |
| 4,645,958 | 2/1987 | Suzuki et al. | 307/597 |
| 4,675,562 | 6/1987 | Herlein et al. | 307/603 |
| 4,694,208 | 9/1987 | Szabó et al. | 307/603 |

FOREIGN PATENT DOCUMENTS 0144853 11/1979 Japan ................................ 328/55

OTHER PUBLICATIONS

Burggraaf, Pieter S., "Lasers in Semiconductor Processing," Semiconductor International, Sep., 1980, pp. 43–60.

Swenson, Edward J., "Some Present and Future Applications of Laser Processing—An Overview," Solid State Technology, Nov., 1983, pp. 156–158.

*Primary Examiner*—Thomas H. Tarcza
*Assistant Examiner*—David Cain
*Attorney, Agent, or Firm*—Worsham, Forsythe, Sampels & Wooldridge

[57] ABSTRACT

A delay circuit that can be implemented in a monolithic integrated circuit includes a plurality of capacitor/laser-fusible link series pairs. Delay of a binary output signal of the circuit with respect to an input transition is directly proportional to the amount of capacitance connected into the circuit. Because the laser-fusible links can selectively be opened with a laser, the amount of capacitance connected into the circuit can incrementally be reduced; thus, the delay of the circuit is reducibly adjustable to a desired value. By including a plurality of conductive element/laser-fusible link series pairs in the delay circuit, the delay of the circuit is also increasingly adjustable. A method for economically adjusting the delay of each of many like delay circuits embodied in a semiconductor wafer includes measuring a sample of the delays of the delay circuits, calculating an average delay, determining the difference between a desired delay and the average delay to determine an incremental amount of delay to eliminate or to add, determining from predetermined data which fusible links should be opened, and using a laser beam to open the appropriate links.

17 Claims, 1 Drawing Sheet

DELAY CIRCUIT FOR A MONOLITHIC INTEGRATED CIRCUIT AND METHOD FOR ADJUSTING DELAY OF SAME

REFERENCE TO RELATED APPLICATION

Reference is made to a related application entitled Temperature Compensated Monolithic Delay Circuit, Ser. No. 828,049, Filed 2/10/86, now refiled as Ser. No. 217,142, Filed 6/30/88 (Inventor Ching-Lin Jiang, which is hereby incorporated by reference. The Jiang application discloses and claims a circuit for providing temperature compensation for a delay circuit in a monolithic integrated circuit.

TECHNICAL FIELD

The present invention generally relates to digital electronic circuits and, more particularly, is concerned with a delay circuit suitable for implementation in a monolithic integrated circuit and a method for adjusting the delay of such a delay circuit.

BACKGROUND OF THE INVENTION

In digital electronic systems, it is frequently desirable to generate a binary logic signal that is delayed with respect to the transition of another logic signal. The delay line is a circuit commonly used for this purpose in memory systems. Presently available delay lines are typically hybrid modules which use discrete or thick-film inductors and capacitors as the primary elements for controlling the time delay of each delay stage in a multi-stage delay line. An appropriate combination of discrete or thick-film inductors and capacitors can provide reasonably accurate time delays, but the cost and reliability advantages of monolithic integrated circuits are well known. Under the present state of the art, however, inductors having practical inductance values cannot economically be fabricated in a monolithic integrated circuit.

In addition to use within hybrid delay line modules, delay stages are also commonly utilized in monolithic integrated circuits, especially in memory integrated circuits, to delay one signal within the integrated circuit with respect to another. Such delay stages are generally implemented with simple inverters or strings of inverters. The time delay of such circuits normally results from the time required to charge or discharge capacitance through a resistive element such as a resistor or an MOS transistor. Due to processing variations in the fabrication of integrated circuits in semiconductor wafers, the time delay of delay stages from one integrated circuit to another may vary considerably, especially from wafer to wafer. Nevertheless, in the usual circumstance, no provision is made for adjusting the delay of a delay stage after the monolithic integrated circuit has been fabricated to be electrically functional.

Among the elements utilized in the present invention are laser-fusible links. A laser-fusible link is a conductive element that can readily be open circuited by exposing the link to a laser beam.

In monolithic integrated circuits, laser-fusible links are typically fabricated of polysilicon and are widely used in random access memory integrated circuits for substituting redundant memory cells in place of defective cells. In such an application, laser-fusible links are blown to disconnect defective memory cells from the memory matrix while other laser-fusible links are blown to enable spare address decoders for the redundant memory cells.

In accordance with the foregoing, a need exists for a delay stage or circuit which (1) can be fabricated in a monolithic integrated circuit and (2) can conveniently and accurately have its delay adjusted subsequent to fabrication of the integrated circuit. A need also exists for a method for economically adjusting the delay of each of many delay circuits of like type which may be batch processed and embodied in a semiconductor wafer.

SUMMARY OF THE INVENTION

The present invention provides a delay circuit suitable for implementation in a monolithic integrated circuit and a method for adjusting the delay of such a delay circuit.

In accordance with one aspect of the present invention, a delay circuit includes (1) a plurality of capacitor/laser-fusible link series pairs connected to an internal signal node, (2) means for precharging the internal signal node to a predetermined voltage in response to one logic state of an input signal, (3) means for discharging the internal signal node to a second predetermined voltage when the input signal transitions to the opposite logic state, and (4) voltage detector means responsive to the voltage of the internal signal node to generate an output signal indicative of when the voltage on the internal signal node has discharged to the second predetermined voltage. Because the delay of the output signal with respect to the input signal is a function of the amount of capacitance connected to the internal signal node and such capacitance may selectively be reduced by selectively blowing or cutting the laser-fusible links, the delay of the circuit is reducibly adjustable.

In one embodiment of the invention the capacitors are all approximately equal in capacitance. In an alternative embodiment of the invention, the plurality of capacitors is comprised of a first set and a second set. In the first set, the capacitance of each capacitor is of approximately equal value; but in the second set, the capacitance of the capacitors forms a binary-weighted sequence of values.

Another aspect of the invention is a method for adjusting the delay of each of a plurality of delay circuits embodied in a semiconductor wafer. The method includes measuring the time delay of a sample of the delay circuits embodied in the semiconductor wafer, and, based upon the measured sample, determining which fusible links should be opened to most accurately adjust the delay, and using a laser beam to open those fusible links.

As should be apparent from the foregoing summary, it is a general object of the present invention to provide a novel delay circuit for an integrated circuit and a method for adjusting the delay of such delay circuit.

Other objects and advantages, and a more complete understanding of the invention may be obtained by referring to the following detailed description of an illustrative embodiment when taken in conjunction with the accompanying drawings.

DETAILED DESCRIPTION OF A PREFERRED EMBODIMENT

Figure 1:
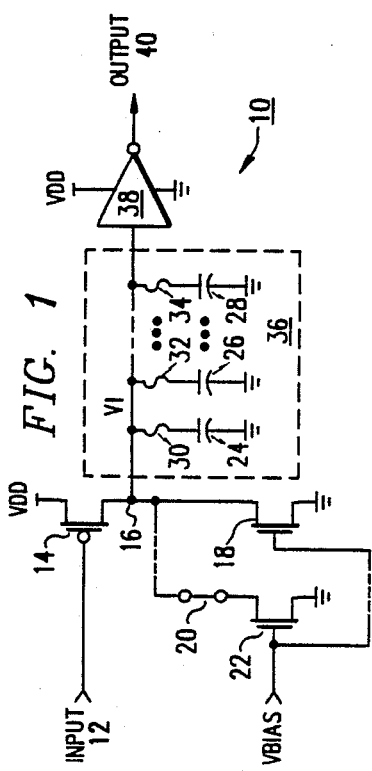
FIG. 1 is an electrical schematic diagram illustrating a delay circuit in accordance with one embodiment of the invention.

Referring now to FIG. 1, an embodiment of a delay circuit according to the present invention is indicated generally by the reference numeral 10. The delay circuit 10 is preferably fabricated using CMOS integrated circuit process technology to produce both N-channel and P-channel enhancement-mode MOSFET transistors in a monolithic integrated circuit. In conventional processing many monolithic integrated circuits of the same type are simultaneously batch processed on a semiconductor wafer.

The delay circuit 10 includes an input node 12 which is connected to the gate electrode of a P-channel transistor 14. The source of the P-channel transistor 14 is connected to a power supply node which is herein designated as VDD. VDD is powered from a power source external to the monolithic integrated circuit in which the delay circuit 10 is embodied, and typically is at a positive 5.0 volts with respect to a ground node, GND. For an alternative embodiment, the source of the P-channel transistor 14 may be connected to a regulated power supply node having a tighter voltage tolerance than VDD. The drain of the P-channel transistor 14 is connected to an internal signal node 16, the voltage on which is designated herein as VI. The P-channel transistor 14 is an enhancement-mode transistor having a threshold voltage to become conductive of approximately negative 0.7 volts from gate to source. The width to length ratio, W/L, of the P-channel transistor 14 in the illustrative embodiment is 126/3.

The drain of a first N-channel transistor 18 is also connected to the internal signal node 16. The first N-channel transistor 18 is an enhancement-mode transistor having a threshold voltage to become conductive of approximately positive 0.7 volts from gate to source. The source of the first N-channel transistor 18 is connected to the ground node, GND, and the gate of the first N-channel transistor 18 is connected to a positive DC bias voltage of sufficient magnitude as to cause the first N-channel transistor 18 to be conductive. This DC bias voltage is herein designated as VBIAS and is typically at 2.6 volts. The above-referenced Jiang application teaches a circuit and method for generating VBIAS to provide temperature compensation for the delay circuit 10. For the present invention, however, it is only necessary that VBIAS be of the proper polarity with respect to the ground node and be greater in magnitude than the threshold voltage of the first N-channel transistor 18. Consequently, during operation of the delay circuit 10, the first N-channel transistor 18 is always conductive. Because the first N-channel transistor 18 is always conductive, other conductive elements such as a resistor or a depletion-mode transistor could be substituted in its place. In the illustrative embodiment, the width to length ratio, W/L, of the first N-channel transistor 18 is 25/12.

A programmable connector element 20 couples the drain of a second N-channel transistor 22 to the internal signal node 16. The second N-channel transistor 22, like the first N-channel transistor 18, has a threshold voltage to become conductive of approximately positive 0.7 volts and has a width to length ratio, W/L, of 25/12. In the illustrative embodiment, the programmable connector element 20 is a portion of a metal interconnect which may be programmed (prior to processing of the integrated circuit) at the metal-mask level to be open-circuited. An alternative for the programmable connector element 20 is a contact site that can optionally be open circuited by modification of the contact mask used in processing the integrated circuit. Another alternative for the programmable connector element 20 is a laser-fusible link which can be open-circuited after the integrated circuit has been fabricated to be electrically functional. The source of the second N-channel transistor 22 is connected to ground and the gate electrode of the second N-channel transistor 22 is connected to the DC bias voltage VBIAS. Accordingly, the second N-channel transistor 22 is optionally connected in parallel with the first N-channel transistor 18.

The delay circuit 10 further includes a plurality of capacitors 24, 26, and 28. Although only the three capacitors 24, 26, and 28 are explicitly illustrated in FIG. 1, it should be understood that other numbers of capacitors may be used. In the illustrative embodiment, each of the capacitors 24, 26, 28 is implemented in the monolithic integrated circuit as a depletion-mode capacitor with a first electrode being a conductive region in the semiconductor body of the monolithic integrated circuit and with a second electrode being separated from the first electrode by a layer of silicon dioxide, the second electrode being comprised of polysilicon having an area of approximately 625 square microns. Each of the capacitors 24, 26, 28 has a capacitance of approximately 0.53 pF.

The delay circuit 10 further includes a plurality of laser-fusible links 30, 32, and 34. Although only the three laser-fusible links 30, 32, and 34 are explicitly illustrated in FIG. 1, it should be understood that the number of laser-fusible links is equal to the number of capacitors used in the delay circuit 10. Each of the laser-fusible links 30, 32, 34 is electrically connected in series respectively with a corresponding one of the plurality of capacitors 24, 26, 28 between the internal signal node 16 and ground. Accordingly, the laser-fusible link 30 and the capacitor 24 form a capacitor/laser-fusible link series pair. Likewise, the laser-fusible link 32 and the capacitor 26 form another capacitor/laser-fusible link series pair, and the laser-fusible link 34 together with the capacitor 28 do likewise. Thus, the laser-fusible links 30, 32, 34 and the capacitors 24, 26, 28 form a plurality of capacitor/laser-fusible link series pairs as indicated by the outline block in FIG. 1 and designated by the numeral 36.

Each of the laser-fusible links 30, 32, 34 is fabricated in the monolithic integrated circuit of polysilicon. Subsequent to the monolithic integrated circuit having been fabricated to be electrically functional, the portion of the polysilicon link that is susceptible to being blown or cut by a laser beam is approximately 0.5 microns thick, 3 microns wide, and 10 microns in length, and is covered by approximately 0.25 to 0.5 microns of silicon dioxide. Such a link can readily be blown or cut with a pulsed laser beam. Commercial machines which produce suitable laser beams for this purpose include the Teradyne Model M118 and the Electro Scientific Industries, Inc. Model 80. Such machines can be aligned and focused to selectively open whichever ones of the laser-fusible links 30, 32, 34 as may be desired. Thus, the amount of capacitance that is connected to the internal signal node 16 is reducibly adjustable after the delay circuit 10 has been fabricated to be functional.

The internal signal node 16 is connected to the input of an inverter 38. The output of the inverter 38 is coupled to an output node 40. The inverter 38 is a conventional CMOS inverter which is powered from VDD and has an input switching threshold of approximately one-half VDD. For an alternative embodiment the inverter 38 may be powered from a regulated power supply node having a tighter voltage tolerance than VDD.

Figure 2:
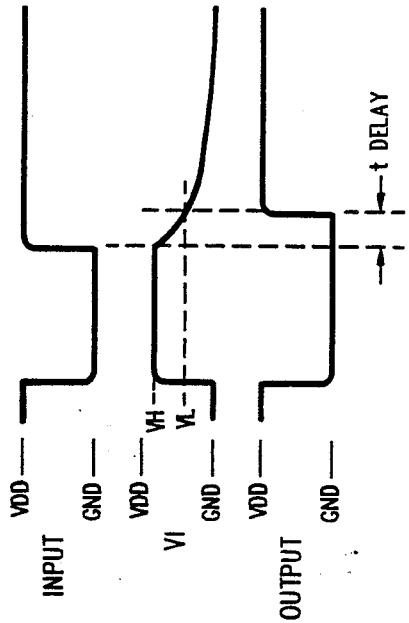
FIG. 2 is a timing diagram corresponding to operation of the delay circuit of FIG. 1.

Referring to FIG. 2, the timing relationship of an input signal, and the voltage VI appearing on the internal signal node 16, and the output signal on the output node 40 is illustrated. The time delay of interest, designated as tDELAY in FIG. 2, commences when the input signal transitions from GND (herein defined as a logic 0) to a voltage of VDD (a logic 1).

Prior to such positive-going transition of the input signal, however, the internal signal node 16 is precharged to a voltage VH as herein described. When the input signal transitions from a voltage of VDD to GND the P-channel transistor 14 is caused to become conductive. Because the width to length ratio of the P-channel transistor 14 is much greater than that of the first N-channel transistor 18 and that of the second N-channel transistor 22, VI precharges toward the voltage VH which is near VDD. Each of the laser-fusible links 30, 32, 34 has a small resistance; consequently, the voltage across each of the capacitors 24, 26, 28 closely follows VI. When the magnitude of VI becomes greater than the switching threshold of the inverter 38, which is designated as VL in FIG. 2, the output transitions from VDD to GND. The time delay from input to output of the foregoing operation is only incidental to the precharging of the internal signal node 16 and is not the desired delay of interest.

When the input signal transitions from GND to VDD, subsequent to the precharging of the internal signal node 16, the P-channel transistor 14 turns off, allowing the first N-channel transistor 18 and the second N-channel transistor 22 to discharge the internal signal node 16 toward GND. When VI reaches the input switching threshold, VL, of the inverter 38, the output of the inverter 38 transitions from GND to VDD, thus providing the time delay of interest.

The time delay of the delay circuit 10 is directly proportional to the amount of capacitance that is connected to the internal signal node 16. Because any of the laser-fusible links 30, 32, 34 can be opened, the amount of capacitance coupled to the internal signal node 16 is reducibly adjustable in increments. Thus, the amount of delay of the delay circuit 10 is reducibly adjustable in increments. The greater the number of capacitor/laser-fusible link series pairs there are, the greater the range of delay adjustment there is. Also, the smaller the amount of capacitance for each of the plurality of capacitors, the smaller is each incremental change in delay.

In the embodiment illustrated in FIG. 1, the inverter 38 operates as a voltage detector. An alternative voltage detector is a two-input comparator wherein one input is connected to the internal signal node 16 and the other input is connected to a DC bias voltage equal to a desired second predetermined voltage.

The time delay of the delay circuit 10 is inversely proportional to the magnitude of the discharge current through the first N-channel transistor 18 and the second N-channel transistor 22. If the programmable connector element 20 is opened to thereby disconnect the drain of the second N-channel transistor 22 from the internal signal node 16, the internal signal node 16 will discharge at a slower rate, causing the time delay of the delay circuit 10 to increase. Accordingly, the delay of the delay circuit 10 is increasingly adjustable. The delay of the delay circuit 10 is increasingly adjustable over a greater range by including a plurality of N-channel transistors (five, for example) optionally connected in parallel with the first N-channel transistor 18.

Figure 3:
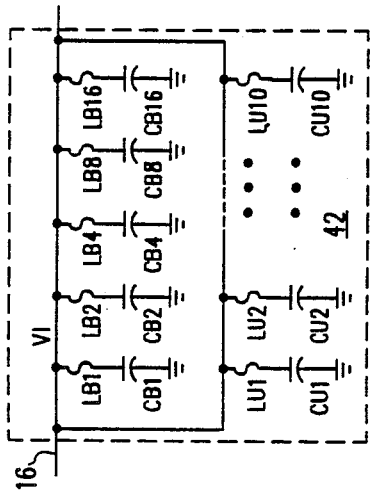
FIG. 3 is an electrical schematic illustrating an alternative embodiment, also in accordance with the present invention, of the capacitor/laser-fusible link series pairs for the delay circuit of FIG. 1.

Referring now to FIG. 3, there is illustrated a plurality of capacitor/laser-fusible link series pairs 42 which may be used as an alternative to the plurality of capacitors/laser-fusible link series pairs 36 of FIG. 1. The plurality of capacitor/laser-fusible link series pairs 42 includes a first set of ten capacitors designated in FIG. 3 as CU1 through CU10. Each of the capacitors CU1 through CU10 is respectively connected through a corresponding laser-fusible link, designated as LU1 through LU10, to the internal signal node 16. Each of the capacitors CU1 through CU10 is fabricated, and is of the same size, as described in conjunction with FIG. 1 for each of the plurality of capacitors 24, 26, 28. Accordingly, in the illustrative embodiment each of the capacitors CU1 through CU10 is a depletion-type capacitor of approximately 625 square microns in area and having a capacitance of approximately 0.53 pF.

Each of a second set of capacitors CB1, CB2, CB4, CB8, and CB16 is coupled through a corresponding laser-fusible link, herein respectively designated as LB1, LB2, LB4, LB8, and LB16, to the internal signal node 16. Thus, each of the capacitors CB1 through CB16 of the second set of capacitors is connected in parallel with each of the capacitors CU1 through CU10 of the first set of capacitors. Like the capacitors CU1 through CU10, each of the capacitors CB1, CB2, CB4, CB8, and CB16 is a depletion-type capacitor. The capacitance values of the capacitors CB1, CB2, CB4, CB8, and CB16, however, form approximately a binary-weighted sequence of capacitance values, with the smallest of the capacitance values being considerably smaller than that of each of the capacitors CU1 through CU10. The capacitor CB1 is constructed to have an area of only approximately 64 square microns for a capacitance of approximately 0.054 pF. The capacitor CB2 is constructed to have an area and capacitance approximately two times that of CB1. Similarly, the capacitor CB4 is approximately two times larger than the capacitor CB2, the capacitor CB8 is approximately two times larger than the capacitor CB4, and the capacitor CB16 is approximately two times larger than the capacitor CB8. This arrangement of the plurality of capacitors permits the delay of the delay circuit 10 to be closely adjusted to a precise value.

Although the foregoing discussion has described use of a P-channel transistor for precharging the capacitors coupled to the internal signal node 16, and N-channel transistors for discharging the capacitors, it will be readily apparent to those of ordinary skill in the art that a complementary implementation of the delay circuit 10 can be made wherein voltage polarities are reversed and N-channel transistors are used in place of P-channel transistors and vice versa.

Other alternative implementations of the delay circuit 10 include substituting any or all of the laser-fusible links with various types of switchable or programmable conductive elements. Suitable elements for this purpose include (1) enhancement-mode MOS transistors and (2) floating-gate MOS transistors such as are used in EEPROMs or in UVPROMs.

Figure 4:
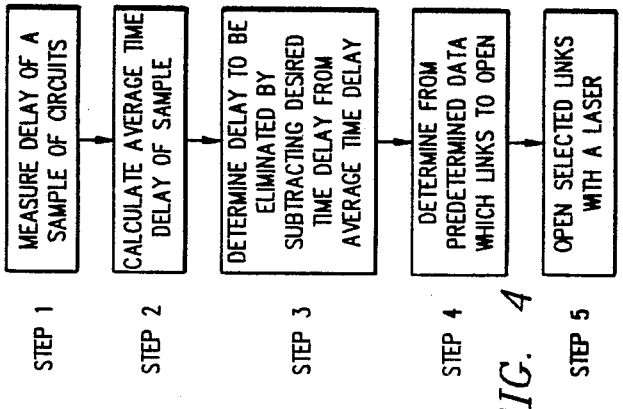
FIG. 4 is a flow chart illustrating a method in accordance with the present invention for adjusting the delay of a delay circuit such as the one illustrated in FIG. 1.

After a semiconductor wafer embodying many delay circuits such as the type herein described has been processed, it is desirable to economically adjust the delay of each delay circuit. For reducibly adjusting the delay of delay circuits of the type herein described wherein capacitor/fusible-link series pairs are utilized, a multi-step procedure as illustrated in the flow chart of FIG. 4 may advantageously be used. For the first step, the time delays of a few (four, for example), but less than all, of the delay circuits embodied in the semiconductor wafer are measured. For the second step, an average time delay is calculated from the sample measurements. In order to reduce the delay of the delay circuits on the semiconductor wafer to a desired time delay, the third step is to determine the incremental amount of delay to be eliminated by subtracting the desired time delay from the average time delay.

From empirical time delay data taken on previously-fabricated delay circuits, a table can be constructed which indicates the amount of delay reduction that can be expected to result from the different possible combinations of open links. For the fourth step, one can then determine from such a table which fusible links of each delay circuit should be opened to most accurately eliminate the desired amount of delay. For the embodiment herein described, it has been found that the delay of the circuit (with two N-channel transistors connected to the internal signal node 16) is typically reduced 5.4 nanoseconds for each unit of capacitance that is removed from the internal signal node 16, a unit of capacitance being defined as a capacitor such as one of the capacitors CU1 through CU10 having an area of 625 square microns. For the fifth step, after having determined then which links should be opened, those links for each delay circuit on the semiconductor wafer are then opened using a laser beam. Such an adjustment method recognizes that the delay from integrated circuit to integrated circuit on the same semiconductor wafer is likely to be fairly uniform.

If even more accuracy is desired, the same procedure or method of adjustment may be followed but with the change of separately measuring the time delay of each delay circuit and separately determining for each such circuit which fusible links should be opened. That is, the delay adjustment is separately determined for each delay circuit rather than doing the same laser trimming to all delay circuits on semiconductor wafer based upon a measurement sample.

For increasingly adjusting the delay of delay circuits of the type herein described wherein a plurality of N-channel transistors are optionally connected in parallel with the first N-channel transistor 18 by the use of laser-fusible links, similar procedures to those described above in conjunction with FIG. 4 may be used. In particular, the first and second steps of a multi-step sample-based procedure are identical to those described above; that is, an average time delay of delay circuits embodied in a semiconductor wafer is calculated from sample measurements. In order to determine the needed incremental amount of additional delay, the third step is to subtract the average time delay from the desired time delay. For the fourth step, one can determine from predetermined data which fusible links connected to the N-channel transistors should be open to most accurately add the amount of delay determined in step three. For the fifth step, a laser beam is used to open the appropriate fusible links.

An alternative, and more accurate, procedure for increasingly adjusting the time delays of the circuits embodied in a semiconductor wafer is to separately measure the time delay of each delay circuit and separately determine which of the fusible links connected to the N-channel transistors should be opened.

The delay circuit of the present invention and method for adjusting the delay of same should be readily understood from the foregoing description. It will be apparent that various changes may be made in the form, construction, and arrangement of the delay circuit and in the steps of the adjustment method without departing from the spirit and scope of the invention.

What is claimed is:

1. A delay circuit fabricated in a monolithic integrated circuit, said delay circuit being adapted for receiving an input signal and having a groundnode, and internal signal node, and an output node, comprising:
    a. a plurality of capacitors;
    b. a plurality of laser-fusible links equal in number to said capacitors, each of said laser-fusible links being electrically connected in series with a corresponding one of said capacitors between said ground node and said internal signal node;
    c. an enhancement-made field-effect transistor, connected to precharge said internal signal node to a first predetermined voltage when said input signal is at a first binary state;
    d. an enhancement-mode field-effect transistor, connected the discharge said internal signal node to a second predetermined voltage when said input signal transitions to the binary logic opposite that of said first binary logic state; and
    e. voltage detector means responsive to the voltage level of said internal signal node and coupled to said output node for generating an output signal on said output node to indicate when the voltage of said internal signal node has discharged to said second predetermined voltage;

whereby an output signal is provided having a delay that is reducibly adjustable with respect to said input signal.

2. The delay circuit according to claim 1 wherein said means for discharging said internal signal node to a second predetermined voltage comprises an MOS enhancement-mode transistor having its source connected to said ground node, its drain connected to said internal signal node, and its gate connected to a DC bias voltage of sufficient magnitude and polarity as to cause said MOS enhancement-mode transistor to be conductive.

3. The delay circuit according to claim 1 wherein said means for discharging said internal signal node to a second predetermined voltage comprises:
    a. a first MOS enhancement-mode transistor having its source connected to said ground node, its drain connected to said internal signal node, and its gate connected to a DC bias voltage of sufficient magnitude and polarity as to causes aid MOS enhancement-mode transistor to be conductive; and
    b. at least one additional MOS enhancement-mode transistor of like conductivity type to that of said first MOS enhancement-mode transistor optionally connected in parallel with said first MOS enhancement-mode transistor.

4. The delay circuit according to claim 1 wherein said means for precharging said internal signal node to a first predetermined voltage comprises an MOS enhancement-mode transistor having its drain connected to said internal signal node and having its source connected to a power supply node, said MOS enhancement-mode transistor having its gate driven by said input signal.

5. The delay circuit according to claim 1 wherein:
   a. said means for discharging said internal signal node to a second predetermined voltage comprises a first MOS enhancement-mode transistor having its source connected to said ground node, its drain connected to said internal signal node, and its gate connected to a DC bias voltage of sufficient magnitude and polarity as to cause said enhancement-mode transistor to be conductive; and
   b. said means for precharging said internal signal node to a first predetermined voltage comprises a second MOS enhancement-mode transistor of a conductivity type opposite that of said first MOS enhancement-mode transistor, said second MOS enhancement-mode transistor having its drain connected to said internal signal node and having its source connected to a power supply node, said second MOS enhancement-mode transistor having its gate driven by said input signal.

6. The delay circuit according to claim 1 wherein each capacitor of said plurality of capacitors is approximately equal in capacitance to each other of said capacitors.

7. The delay circuit of claim 1 wherein said plurality of said capacitors is comprised of:
   a. a first set of capacitors wherein each capacitor of said first set of capacitors is approximately equal in capacitance to each other of said first set; and
   b. a second set of capacitors wherein the capacitance values of the capacitors comprising said second set form approximately a binary-weighted sequence of capacitance values, the smallest of the capacitance values of said second set being substantially less than that of each of said first set of capacitors.

8. A method of reducibly adjusting the delay of each of a plurality of more than two delay circuits of the same type embodied in a semiconductor wafer, each of said delay circuits including therein a plurality of capacitors and a plurality of laser-fusible links equal in number to said capacitors, each of said laser-fusible links being electrically connected in series with a corresponding one of said capacitors to thereby form a plurality of capacitor/laser-fusible link series pairs, each capacitor/laser-fusible link series pair initially being connected to an internal signal node, the delay of said delay circuit being directly proportional to the amount of capacitance that is connected to said internal signal node, comprising the following steps:
   a. measuring the time delay of at least two but less than all of said delay circuits;
   b. calculating the average of the measured time delays of step a;
   c. subtracting a time delay desired from the average time delay of step b to determine an amount of delay to be eliminated;
   d. determining from predetermined data which fusible links of each delay circuit should be opened to most accurately eliminate the amount of delay determined in step c; and
   e. opening with a laser beam each of the fusible links as determined in step d.

9. A method of reducibly adjusting the delay of a delay circuit embodied in a monolithic integrated circuit to a desired time delay, said delay circuit including therein a plurality of capacitors and a plurality of laser-fusible links equal in number to said capacitors, each of said laser-fusible links being electrically connected in series with a corresponding one of said capacitors to thereby form a plurality of capacitor/laser-fusible link series pairs, each capacitor/laser-fusible link series pair initially being connected to an internal signal node, the delay of said delay circuit being directly proportional to the amount of capacitance that is connected to said internal signal node, comprising the following steps:
   a. measuring the time delay of said delay circuit;
   b. subtracting the time delay desired from the measured time delay of step a to determine an amount of delay to be eliminated;
   c. determining from predetermined data which fusible links of said delay circuit should be opened to most accurately eliminate the amount of delay as determined in step b; and
   d. opening with a laser beam each of the fusible links as determined in step c.

10. A method of increasingly adjusting the delay of each of a plurality of more than two delay circuits of the same type embodied in a semiconductor wafer, each of said delay circuits including therein a plurality of conductive elements and a plurality of laser-fusible links equal in number to said conductive elements, each of said laser-fusible links being electrically connected in series with a corresponding one of said conductive elements to thereby form a plurality of conductive element/laser-fusible link series pairs, each conductive element/laser-fusible link series pair initially being connected to an internal signal node, the delay of said delay circuit being inversely proportional to the number of conductive elements that are connected to said internal signal node, comprising the following steps:
   a. measuring the time delay of at least two but less than all of said delay circuits;
   b. calculating the average of the measured time delays of step a;
   c. subtracting the average time delay of step b from a time delay desired to determine a needed incremental amount of additional delay;
   d. determining from predetermined data which fusible links of each delay circuit should be opened to most accurately add the incremental amount of delay determined in step c; and
   e. opening with a laser beam each of the fusible links as determined in step d.

11. A method of increasingly adjusting the delay of a delay circuit embodied in a monolithic integrated circuit to a desired time delay, said delay circuit including therein a plurality of conductive elements and a plurality of laser-fusible links equal in number to said conductive elements, each of said laser-fusible links being electrically connected in series with a corresponding one of said conductive elements to thereby form a plurality of conductive element/laser-fusible link series pairs, each conductive element/laser-fusible link series pair initially being connected to an internal signal node, the delay of said delay circuit being inversely proportional to the number of conductive elements that are connected to said internal signal node, comprising the following steps:

a. measuring the time delay of said delay circuit;
b. subtracting the measured time delay of step a from the time delay desired to determine a needed incremental amount of additional delay;
c. determining from predetermined data which fusible links of said delay circuit should be opened to most accurately add the incremental amount of delay as determined in step b; and
d. opening with a laser beam each of the fusible links as determined in step c.

12. A integrated circuit delay circuit, comprising:
a. a plurality of capacitors;
b. a plurality of laser-fusible links each electrically connected, in series with a corresponding one of said capacitors, between an internal signal node and ground;
c. a transistor connected to precharge said internal signal node to a first predetermined voltage when said input signal is at a first binary state;
d. a transistor connected to discharge said internal signal node to a second predetermined voltage when said input signal transitions to the binary logic opposite that of said first binary logic state, and
e. a voltage detector which generates an output signal when the voltage of said internal signal node has discharge to said second predetermined voltage;
whereby said output signal is provided with a delay, with respect to said input signal, which is reducibly adjustable.

13. The circuit of claim 1, wherein said voltage detector means comprises essentially of an inverter.

14. The circuit of claim 1, wherein said voltage detector means comprises an inverter.

15. The circuit of claim 1, wherein said voltage detector means comprises a comparator.

16. The circuit of claim 12, wherein said voltage detector comprises an inverter.

17. The circuit of claim 12, wherein said voltage detector comprises a comparator.

* * * * *